Dec. 23, 1969

SHUNSUKE TAKADA 3,486,083

CAR ALTERNATOR SEMICONDUCTOR DIODE AND RECTIFYING CIRCUIT ASSEMBLY

Filed Nov. 22, 1966

2 Sheets-Sheet 1

3,486,083

CAR ALTERNATOR SEMICONDUCTOR DIODE AND RECTIFYING CIRCUIT ASSEMBLY

Shunsuke Takada, Osaka, Japan, assignor to Matsushita Electronics Corporation, Osaka, Japan, a corporation of Japan Filed Nov. 22, 1966, Ser. No. 596,317
Claims priority, application Japan, Nov. 22, 1965, 40/72,371, 40/72,372
Int. Cl. H01l *3/00, 5/00;* H05k *5/06*
U.S. Cl. 317—234 2 Claims

ABSTRACT OF THE DISCLOSURE

A semiconductor full wave rectifier assembly formed of pairs of encapsulated diodes opposingly mounted between a pair of like heat sinks. The diodes are assembled and fixed by a heat treatment in situ.

The present invention relates to a car alternator semiconductor diode and a rectifying circuit assembly.

The present invention also relates to a novel method of constructing a small-sized car alternator diode which uses a heat sink as an outer lead wire and which is provided according to a plastic encapsulation method.

An object of the invention is to provide a small-sized car alternator semiconductor diode whose size is reduced as much as possible and whose structure is exteremely simplified. The car alternator diode according to the present invention has advantages over the conventional devices in that cost reduction may be achieved because it is possible to reduce the number of parts as well as the number of required manufacturing processes.

Another object of the invention is to make the three phase full wave rectifying circuit assembly necessary for charging a car battery with a three phase alternating current generated by a car alternator, as small as possible.

Other objects, features and advantages of the present invention will become apparent from the following detailed description of the invention when taken in conjunction with the accompanying drawings, in which.

According to a known method of assembling a car alternator semiconductor diode used for rectifying an AC output voltage from a car alternator, the outer surfaces of the case for the car alternator semiconductor diode are subjected to knurling treatment, said semiconductor diode is inserted by a compressed insertion method into a hole provided on a heat sink and then said sink is installed into the car alternator case.

According to such a method, however, a considerable amount of pressure is applied to the sides of the car alternator semiconductor diode when the diode is inserted into the heat sink and so the diode may be damaged. In order to avoid the breakdown of the diode, the diode case must be made of a rather thick material.

Further, since it has been considered that the heat generated, while the diode is working, is radiated from all the parts of the diode case, the diode itself has generally been made rather large.

Figure 1:
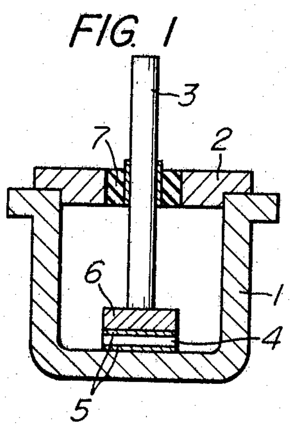
FIG. 1 shows a known car alternator semiconductor diode.

FIG. 1 is a sectional diagram of a known car alternator semiconductor diode. In the figure, reference numeral 1 indicates a glass-shaped case for the diode fabricated of copper of about 2.4 mm. in thickness with a press.

On the base of said diode case, a disk shaped layer of solder 5; a silicon wafer 4, wherein a P-N junction is formed by diffusing boron or phosphor; another disk shaped layer of solder 5; and finally a block of copper 6, having the effect of absorbing transient thermal pulses produced during the operation of the diode which is at the same time used for deriving an electrode lead 3, are laminated in the order described above.

Then the whole diode case is heated to solder the silicon wafer 4 to the metal case 1 and the silicon wafer 4 to the block of copper 6 with the disk shaped layers of solder 5.

Then a cover consisting of a plate of insulating glass 7 whose outer circumference is surrounded by a ring 2 formed of metal, for example iron, and an outer lead wire 3 penetrating through the center of said plate of insulating glass is electrically welded to the flange of the diode case 1 for encapsulation and thus a conventional car alternator semiconductor diode is provided.

In such a conventional car alternator semiconductor diode, the cap 2 is always necessary for maintaining the airtightness of the diode case and for preventing thereby the deterioration of the elements. Since the cap must keep gas tight and include a lead wire penetrating therethrough, the number of process steps is large and thus the cost required for manufacturing the cap is not negligible.

Also, since a compressed insertion method has been employed in setting the car alternator semiconductor diode into the heat sink, the case for the diode must be made of a material of sufficient thickness to withstand the mechanical strain. Thus, the conventional device has been quite uneconomical.

Further, since the conventional car alternator semiconductor diode has been set according to a compressed insertion method, the diode case must be made rather large and the contact area between the heat sink and the diode case must be made large to facilitate dissipitation of the heat generated during the operation of the diode. Thus, the diode itself has been made rather large.

Such a large-sized car alternator semiconductor diode is unfavorable because the diode must be installed into a narrow space within the car alternator and sometimes the car alternator itself must be made large.

As is explained above, the known car alternator semiconductor diodes are unsatisfactory from an economic point of view as well as from the viewpoint of application.

Figure 2:
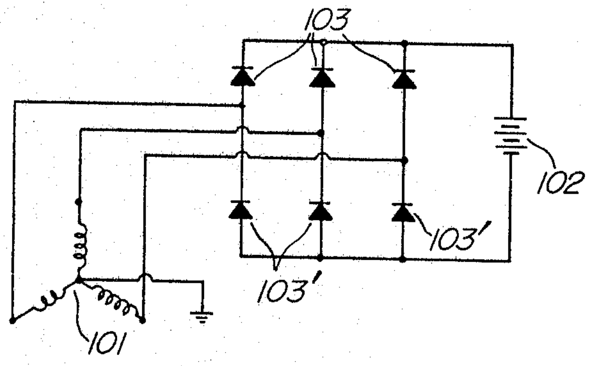
FIG. 2 is a circuit diagram of a charging circuit using a three phase full wave rectifying circuit.

In order to achieve the objects of obtaining direct current to be used for charging a car battery and to be supplied to electric circuits of a car by rectifying an AC output current from an AC generator coupled directly to an engine, a three phase full wave rectifying circuit, as shown in FIG. 2, has conventionally been employed.

Figure 3:
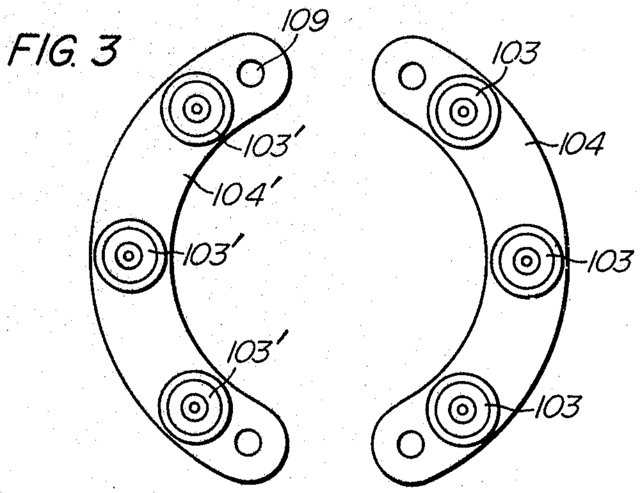
FIG. 3 is a plan view of a known assembly of car alternator diodes set to a heat sink so as to form the three phase full wave rectifying circuit shown in FIG. 2.

In FIG. 2, reference numeral 101 indicates a three phase car AC generator, 102 a car battery, and 103 and 103' designate car alternator diodes. It is to be noted that accessories like a cut-out relay are not shown in the figure. FIG. 3 illustrates an example of a known method of mounting a car alternator diode for composing said three phase full wave rectifying circuit.

Figure 4:
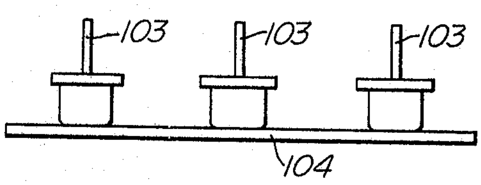
FIG. 4 is a side view of the known assembly of car alternator diodes shown in FIG. 3.

In FIG. 3, 104, 104' designate metal heat sinks having a good thermal conductivity, such as copper, on each of which three car alternator diodes 103 and 103' are mounted. According to a known method, a knurling is provided at the outer circumference of the diode and said knurling is inserted by a compressed insertion method into a hole in the heat sink. However, if a better thermal conductivity is to be obtained, it is more appropriate to employ a method in which the base of the metal case forming one of the electrodes of the car alternator diode is fixed on the heat sink 104 by soldering as shown in FIG. 4. Thus by using a pair of rectifying devices, each of which consists of three car alternator semiconductor diodes mounted on one heat sink, and providing necessary electric connections thereto, a three phase full wave rectifying circuit is formed. Namely, the three car alternator diodes 103 provided on the first heat sink 104 pass the half cycle of the three phase AC output voltage from the car alternator each phase of which is shifted by 120° with respect to each other, but do not pass the following half cycle. Conversely, the three car alternator diodes 103' provided on the heat sink 104' operate oppositely to the diodes 103. Such a three phase full wave rectifying circuit assembly has conventionally been formed by setting car alternator diodes on two heat sinks of a circular arc shape as shown in FIG. 3. When installing the assembly into the car alternator, said two heat sinks are arranged into a circular form. However, such an arrangement is not preferable when considered from the standpoint that space should be fully utilized.

The present invention is intended to obviate the deficiencies described hereinabove and to provide a novel car alternator semiconductor diode having effects remarkably superseding the effects possessed by known car alternator semiconductor diodes.

The most important point of the invention lies in the fact that the size of the diode is reduced as much as possible without harming the characteristics thereof, based upon the economic principle that the parts of the diode be made full use of and that waste be avoided thoroughly.

Figure 5:
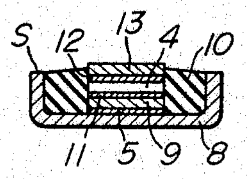
FIG. 5 is a sectional diagram of a car alternator diode embodying the present invention.

For better understanding of the invention, the embodiment of the invention will be described hereinbelow with reference to FIG. 5. In FIG. 5 reference numeral 8 indicates a dish-shaped diode case formed of copper of about 0.4 mm. in thickness. When the thickness and the size of this case is compared with those of the known diode case shown in FIG. 1, it turns out that the thickness of the case material is reduced from 2.4 mm. to 0.4 mm., i.e. by factor ⅙, the case height from 9.2 mm. to 2.3 mm., i.e. by factor ¼ and the outer diameter of the case from 15.7 mm. to 8.6 mm., i.e. by factor about ½, and thus the size of the diode case is reduced remarkably.

The reason why such a drastic reduction of size has been made feasible lies in that instead of the known method of assembling a diode into a heat sink, i.e. by a compressed insertion method, there is employed a novel method according to which the base of the diode case is directly connected to the heat sink with a eutectic solder having a melting point of about 180° C. and that a structure is employed in which the cap of a conventional car alternator semiconductor diode for gas tight encapsulation is not required.

On the base of said dish-shaped diode case 8, there are laminated a disk-shaped layer of an alloy solder of lead, indium and silver and having a melting point of about 280° C., a thin plate 9 formed of copper and having the effect of absorbing thermal pulses, a second disk-shaped layer of solder 11, a silicon wafer 4 which includes a P-N junction formed by diffusing boron or phosphor and whose surfaces are covered with $SiO_2$ films, a third disk-shaped layer of solder 12 and finally a terminal made of copper wafer 13 which constitutes one of the terminals of the diode and which absorbes thermal pulses in the order described above. Said second and third layers of solder like the first are made of a solder having a melting point of about 280° C.

Then the diode case is heated to about 400° C., in a heating oven having an inactive atmosphere, to solder all of said parts at the same time with the first to third disks.

In this car alternator semiconductor diode, an electrode lead as used in conventional devices is not used, but instead a plate terminal of copper 13 is used and so the setting of said car alternator semiconductor diode to the heat sink and the electric connection for forming a rectifying circuit are done by soldering the outer base of the metal case 8 to the heat sink and by fitting a connection plate, which is parallel to the heat sink to the terminal 13.

Now, unless the upper surface of the metal plate terminal 13 is positioned higher than the upper surface of the diode case 8, the accident of short-circuit may take place between the metal case 8 forming one of the electrode terminals and the metal electrode plate 13 constituting the other electrode terminal after the electric connection necessary for said car alternator semiconductor diode is completed. Therefore, it is important to ensure that the upper surface of the laminated layers, after all the parts are soldered to the interior of the diode case, i.e. the upper surface of the metal electrode plate 13, is higher than the topmost surface of the diode case 8.

Further, when manufacturing the car alternator semiconductor diode, it is advisable to use soft solder as said solder in order to prevent the breakdown of the element due to thermal fatigue. In this respect, said mixed solder is used.

After the completion of the assembly, the gaps in said diode case are filled and set with a thermostable insulating filler 10 like epoxy resin. The epoxy resin withstands the heat of 250° C. after it sets.

When filling the case with the filler 10, care must be taken to assure that the surfaces of the metal plate terminal 13 is not covered with said filler and that the semiconductor wafer 4 is completely covered. The reason is as follows. If the filler covers the surfaces of the metal plate terminal 13, a complete electric connection may not be achieved when placing the car atlernator semiconductor diode into a required circuit assembly. If the filler does not cover the semiconductor wafer 4, said element may sometimes be damaged because, though said element 4 is covered with $SiO_2$ films, said $SiO_2$ film is very thin.

Finally, the outer surfaces of the diode case; filled with the required substances, are plated with tin to finish the diode.

As has become apparent from the foregoing detailed description of an embodiment of the invention, the car alternator semiconductor diode according to the present invention has the following advantages over the known car alternator semiconductor diodes.

(1) The manufacturing process may be extremely simplified because it requires no cap and no electric welding thereof.

(2) Cost may be drastically reduced because it requires no cap and the manufacturing process is quite simplified.

(3) The size may be remarkably reduced because of the absence of the cap.

For instance, comparison of the device according to the invention with the known device shown in FIG. 1 shows that the weight is reduced by factor about 1/15 since the known device weighs about 9.0 g. and the present device weighs about 0.6 g.

(4) The small-sized car alternator semiconductor diode according to the invention may be easily installed into a very small space formed by a car alternator and accordingly it is also preferable for reducing the size of the car alternator case.

(5) Since the present car alternator semiconductor diode is small and light, it is possible to reduce the cost of the package and transportation required in transporting said device.

(6) Though the car alternator semiconductor diode according to the invention is small, the heat generated during the operation of said diode is efficiently dissipated from the base of the diode case and so the thermal endurance thereof is almost the same as that of the conventional device.

(7) The surfaces of the semiconductor wafer are protected with the filler and naturally the device is also quite stable electrically.

Further, the rectifying circuit assembly using the car alternator semiconductor diode according to the invention is fabricated in a novel method of mounting the car alternator diode according to which is provided a three phase full wave rectifying circuit assembly whose size is drastically reduced in comparison with said known three phase full wave rectifying circuit assembly. Now, said small-sized circuit assembly embodying the present invention will be described hereinbelow with reference to FIGS. 6 to 8.

Figure 6:
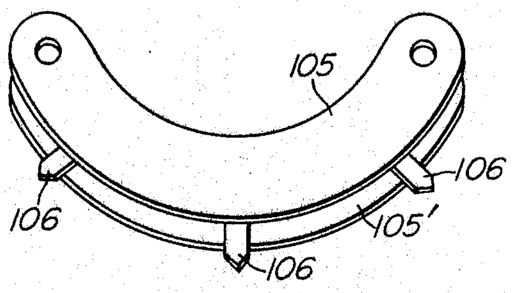
FIG. 6 is a perspective view of a car alternator diode assembly according to the invention.

FIG. 6 is a perspective view of a car three phase full wave rectifying circuit assembly embodying the present invention.

In the figure, 105 and 105' designate heat sinks made of a material having a good thermal conductivity, such as copper, and 106 is an input terminal for a three phase alternating current generated by a car alternator.

Figure 7:
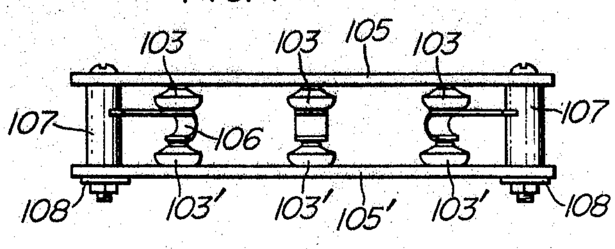
FIG. 7 is a front view of the car alternator diode assembly shown in FIG. 6.

FIG. 7 is a front view of the assembly shown in FIG. 6 for the illustration of said assembly and the method of setting the car alternator semiconductor diode.

In the figure, reference numerals 103 and 103' indicate the car alternator semiconductor diodes shown in FIG. 5.

These thin car alternator semiconductor diodes 103 and 103' are attached to metal heat sinks with solder having a relatively low melting point, for example solder formed of 60% tin and 40% lead. To the upper heat sink 105 is attached the upper surface of the upper cathode electrode with solder at 215° C. and the base of the diode case forming the anode electrode of the car alternator diode 103' is similarly attached to the lower heat sink 105' with solder at 215° C.

Figure 8:
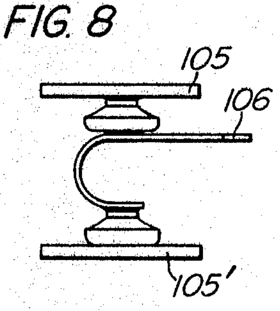
FIG. 8 is a fragmentary exploded view of a car alternator diode assembly according to the present invention.

Then the two heat sinks 105 and 105' provided with the car alternator semiconductor diodes are electrically insulated and fixed face to face with an electrically insulating cylinder 107, such as hard rubber, and an insulating washer 108. Accordingly, the base of the metal case for the car alternator semiconductor diode 103 i.e. the anode electrode faces the metal electrode forming the cathode electrode of the car alternator diode 103'. Then a metal plate 106 having elasticity, such as Phosphor bronze, is formed into a shape having the spring action as shown in FIG. 8 and set with solder to constitute an input terminal for an AC output current from the car alternator. Thus, the three phase full wave rectifying circuit assembly is provided.

The metal plate 106, formed so as to have spring action, has the preferable effect of absorbing a mechanical shock when a mechanical impulse is applied to said three phase full wave rectifying assembly.

In order to absorb the mechanical impulse, a buffer spring has conventionally been inserted between the rectifying element placed within the diode and the outer lead wire. However, according to the present embodiment the structure of the diode may be simplified in comparison with that of known diodes as described above and the number of the connection wires may be also reduced. In the three phase full wave rectifying circuit assembly of the present embodiment fabricated as described above, the car alternator semiconductor diode to be set to the heat sink is made much thinner. Therefore, even the assembly of a pair of heat sinks for full wave rectification positioned face to face, as shown in the figure, is not greater in height than the single heat sink for half wave rectification provided with three conventional car alternator semiconductor diodes and thus said assembly is drastically reduced in size compared with known three phase full wave rectifying circuit assemblies. Accordingly said assembly is quite preferable considering the space of the car alternator into which said assembly is to be installed.

When installing said three phase full wave rectifying circuit assembly into the container of the car alternator, it is important to insert a thermally insulating support body between the body of the car alternator and said circuit assembly so as to prevent the heat generated by the alternator from effecting said three phase full wave rectifying circuit.

Though the heat sink of a circular arc form is used in the embodiment described above, the shape of the heat sink is not restricted to a circular arc form.

For example, a rectilinear or annular heat sink may be used.

What is claimed is:

1. A semiconductor device comprising a dish-shaped metal case, a lamination of a first disk-shaped plate of solder, a metal plate capable of absorbing thermal currents, a second disk of solder, a semiconductor wafer, a third disk of solder, and a metal terminal plate being placed within said case, and heated to bond said laminate together and to said case, an electrically insulating and thermostable filler substantially filling any voids between said case and said laminate, said terminal plate projecting above the sides of said case.

2. A rectifying circuit assembly comprising: a plurality of semiconductor diodes each of which is defined by a disc-shaped plate of solder, a metal plate for absorbing thermal pulses, a second solder plate, a semiconductor wafer and a metal plate terminal laminated in said order in the base of a dish-shaped metal case constituting one of the terminals of a diode; the uppermost surface of said metal case being positioned lower than the upper surface of said metal plate terminal placed at the topmost of said laminated layers, and the gaps between said metal case and the laminated parts being filled with electrically insulating and heat resisting filler in such a way that said filler completely covers the semiconductor wafer without covering the upper surface of said metal plate terminal; two heat sinks, a plurality of said semiconductor diodes being soldered to one surface of the first heat sink by the bases of said metal cases, and a plurality of said semiconductor diodes being soldered to one surface of the second heat sink by the upper surface of said metal plate terminals, each terminal forming an electrode of a polarity opposite to that of said metal case, the surface of the first and the second heat sinks, each of which is provided with semiconductor diodes being positioned face to face and having an insulated relation to each other; and a plurality of electrically conducting elastic plates soldered between the metal plate terminals of the diodes associated with the first heat sink and the metal case of the diodes associated with the second heat sink, said elastic plates exerting a pressure on each of said first and second heat sink through the associated diodes.

References Cited

UNITED STATES PATENTS

| | | | |
|---|---|---|---|
| 2,781,480 | 2/1957 | Mueller | 317—234 |
| 2,981,873 | 4/1961 | Eannarino et al. | 317—234 |
| 2,986,678 | 5/1961 | Andres et al. | 317—234 |
| 3,331,997 | 7/1967 | Kling et al. | 317—234 |
| 3,356,914 | 12/1967 | Whigham et al. | 317—234 |
| 3,375,415 | 3/1968 | Finn | 317—234 |

JAMES D. KALLAM, Primary Examiner
R. F. POLISSACK, Assistant Examiner

U.S. Cl. X.R.

174—50.5